(12) United States Patent
Chiu et al.

(10) Patent No.: US 12,096,703 B2
(45) Date of Patent: Sep. 17, 2024

(54) SEMICONDUCTOR DEVICE AND MANUFACTURING METHOD OF SEMICONDUCTOR DEVICE

(71) Applicant: XIAMEN INDUSTRIAL TECHNOLOGY RESEARCH INSTITUTE CO., LTD., Fujian (CN)

(72) Inventors: Taiwei Chiu, Xiamen (CN); Tingying Shen, Xiamen (CN); Qi Xiang, Xiamen (CN)

(73) Assignee: XIAMEN INDUSTRIAL TECHNOLOGY RESEARCH INSTITUTE CO., LTD., Xiamen (CN)

( * ) Notice: Subject to any disclaimer, the term of this patent is extended or adjusted under 35 U.S.C. 154(b) by 159 days.

(21) Appl. No.: 18/009,530

(22) PCT Filed: Jun. 29, 2021

(86) PCT No.: PCT/CN2021/103127
§ 371 (c)(1),
(2) Date: Dec. 9, 2022

(87) PCT Pub. No.: WO2022/022201
PCT Pub. Date: Feb. 3, 2022

(65) Prior Publication Data
US 2023/0225226 A1 Jul. 13, 2023

(30) Foreign Application Priority Data
Jul. 31, 2020 (CN) .......................... 202010760550.9

(51) Int. Cl.
*H10B 63/00* (2023.01)
*H10N 70/00* (2023.01)

(52) U.S. Cl.
CPC ........... *H10N 70/021* (2023.02); *H10B 63/80* (2023.02); *H10N 70/063* (2023.02); *H10N 70/841* (2023.02)

(58) Field of Classification Search
CPC .. H10N 70/021; H10N 70/063; H10N 70/841; H10N 70/011; H10N 70/801;
(Continued)

(56) References Cited

U.S. PATENT DOCUMENTS

| 10,868,246 B2* | 12/2020 | Karpov | H10N 70/8416 |
| 2004/0145850 A1* | 7/2004 | Fukumoto | B82Y 25/00 |
| | | | 361/143 |
| 2009/0120791 A1* | 5/2009 | Miyashita | G01N 27/4077 |
| | | | 204/412 |
| 2010/0025729 A1* | 2/2010 | Abrokwah | H01L 23/3192 |
| | | | 257/E21.403 |
| 2010/0187591 A1* | 7/2010 | Nagashima | H10N 70/20 |
| | | | 257/314 |

(Continued)

FOREIGN PATENT DOCUMENTS

| CN | 106654004 A | 5/2017 |
| CN | 107403822 A | 11/2017 |
| CN | 112018237 A | 12/2020 |

OTHER PUBLICATIONS

International Search Report mailed on Oct. 11, 2021, in International Application No. PCT/CN2021/103127 (6 pages).

*Primary Examiner* — Michael T Tran
(74) *Attorney, Agent, or Firm* — Maier & Maier, PLLC

(57) ABSTRACT

A semiconductor device and a manufacturing method of the semiconductor device. The semiconductor device includes: a semiconductor substrate; a bottom electrode metal layer located in the semiconductor substrate and a top electrode metal layer located on the semiconductor substrate; a resistive layer located between the bottom electrode metal layer and the top electrode metal layer, where the resistive layer has a variable resistance; a first oxygen grasping layer located between the bottom electrode metal layer and the top electrode metal layer, where the first oxygen grasping layer is located above the resistive layer; a second oxygen grasping layer located in the bottom electrode metal layer, where
(Continued)

S21: forming a bottom electrode metal layer in a semiconductor substrate, where the bottom electrode metal layer includes a second oxygen grasping layer; and upper surfaces of the semiconductor substrate, the bottom electrode metal layer, and the second oxygen grasping layer are flush

↓

S22: depositing a resistive layer composition material, a first oxygen grasping layer composition material, and a top electrode metal layer composition material on the upper surfaces of the semiconductor substrate, the bottom electrode metal layer, and the second oxygen grasping layer in sequence

↓

S23: patterning the resistive layer composition material, the first oxygen grasping layer composition material, and the top electrode metal layer composition material to form a resistive layer, a first oxygen grasping layer, and a top electrode metal layer, where the resistive layer has a variable resistance upper surfaces of the semiconductor substrate, the bottom electrode metal layer, and the second oxygen grasping layer are flush, and the resistive layer covers the semiconductor substrate, the bottom electrode metal layer, and the second oxygen grasping layer.

12 Claims, 6 Drawing Sheets

(58) Field of Classification Search
CPC .. H10N 70/24; H10N 70/826; H10N 70/8418; H10N 70/8833; H10N 70/20; H10B 63/80
USPC .................................................. 365/148, 158
See application file for complete search history.

(56) References Cited

U.S. PATENT DOCUMENTS

| | | | |
|---|---|---|---|
| 2012/0075913 A1* | 3/2012 | Kunitake | G11C 13/0069 365/148 |
| 2014/0268993 A1* | 9/2014 | Chiang | G11C 13/0007 365/148 |
| 2015/0137286 A1 | 5/2015 | Guo | |
| 2015/0188039 A1 | 7/2015 | Wang et al. | |
| 2019/0288197 A1* | 9/2019 | Desu | H10N 70/801 |
| 2020/0106010 A1 | 4/2020 | Kong et al. | |
| 2020/0144496 A1* | 5/2020 | Glassman | G11C 13/004 |
| 2020/0388759 A1* | 12/2020 | Liu | H10N 70/24 |
| 2021/0104666 A1* | 4/2021 | Fu | H10B 63/80 |

* cited by examiner

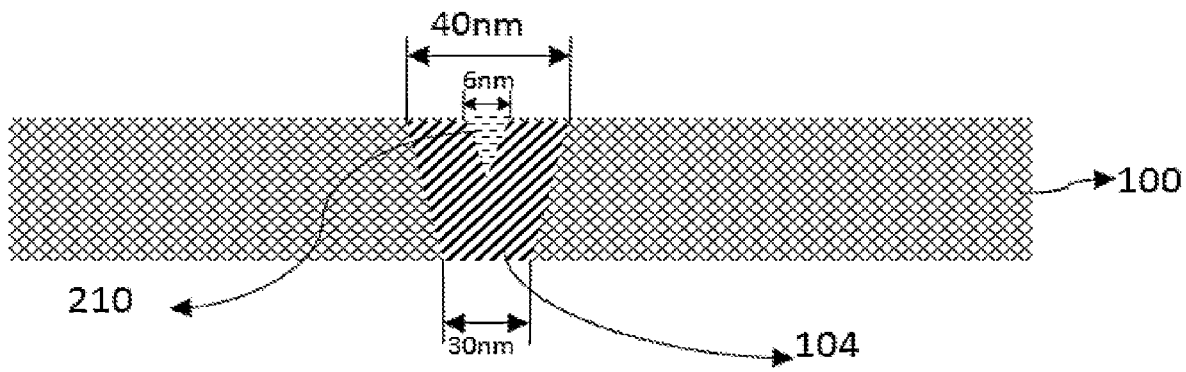

FIG. 3

| S21: forming a bottom electrode metal layer in a semiconductor substrate, where the bottom electrode metal layer includes a second oxygen grasping layer; and upper surfaces of the semiconductor substrate, the bottom electrode metal layer, and the second oxygen grasping layer are flush |
|---|

↓

| S22: depositing a resistive layer composition material, a first oxygen grasping layer composition material, and a top electrode metal layer composition material on the upper surfaces of the semiconductor substrate, the bottom electrode metal layer, and the second oxygen grasping layer in sequence |
|---|

↓

| S23: patterning the resistive layer composition material, the first oxygen grasping layer composition material, and the top electrode metal layer composition material to form a resistive layer, a first oxygen grasping layer, and a top electrode metal layer, where the resistive layer has a variable resistance |
|---|

FIG. 4

SEMICONDUCTOR DEVICE AND MANUFACTURING METHOD OF SEMICONDUCTOR DEVICE

CROSS REFERENCE TO RELATED APPLICATION

The present disclosure is based on the Chinese patent application No. 202010760550.9, filed on Jul. 31, 2020, with a title of "SEMICONDUCTOR DEVICE AND MANUFACTURING METHOD OF SEMICONDUCTOR DEVICE", and claims the priority of the Chinese patent application, the entire contents of which are hereby incorporated by reference.

TECHNICAL FIELD

The present disclosure relates to the field of semiconductor technologies, in particular to a semiconductor device and a manufacturing method of the semiconductor device.

BACKGROUND

As a new non-volatile memory, Resistive Random Access Memory (RRAM) has advantages of simple structure, fast work speed, low power consumption and stable information retention, which is one of strong competitors of the next generation non-volatile memory.

FIG. 1 is a structural diagram of an existing RRAM. The RRAM includes a bottom electrode metal layer 104, a resistive layer 108, an oxygen grasping layer 110, and a top electrode metal layer 106 provided and stacked from bottom to top. The resistive layer 108 with a resistive effect interconverts between resistance states (high resistance state and low resistance state) under the action of applied voltage, forming binary information storage of "0" state and "1" state. Many materials, including metal oxide, have outstanding resistive performance A resistive mechanism is based on the formation of a conductive filament by the aggregation of oxygen vacancies and other defects. After the grasping oxygen layer grasps oxygen atoms in a metal oxide resistive material, the oxygen vacancies are left in the resistive material, which is a main defect in the metal oxide resistive material.

A resistive structure of the existing RRAM is produced after depositing all films at one time and then etching to define a pattern. Since the resistive structure is a flat structure, a location of an area formed by the conductive filament in the resistive layer cannot be predicted. The conductive filament may be formed on both sides of the resistive layer or in a central area of the resistive layer, which reduces uniformity of a resistance value of the RRAM, thereby reducing reliability of the RRAM, and hindering large-scale integration and practical application of the RRAM.

SUMMARY

A purpose of embodiments of the present disclosure is to provide a semiconductor device and a manufacturing method of the semiconductor device, in order to at least solve the above technical problem.

To achieve the above purpose, the embodiments of the present disclosure provide a semiconductor device, including:
 a semiconductor substrate;
 a bottom electrode metal layer located in the semiconductor substrate and a top electrode metal layer located on the semiconductor substrate;
 a resistive layer located between the bottom electrode metal layer and the top electrode metal layer, where the resistive layer has a variable resistance;
 a first oxygen grasping layer located between the bottom electrode metal layer and the top electrode metal layer, where the first oxygen grasping layer is located above the resistive layer; and
 a second oxygen grasping layer located in the bottom electrode metal layer, where upper surfaces of the semiconductor substrate, the bottom electrode metal layer and the second oxygen grasping layer are flush, and the resistive layer covers the semiconductor substrate, the bottom electrode metal layer, and the second oxygen grasping layer.

The semiconductor device further includes:
 an oxygen barrier layer located between the resistive layer and the first oxygen grasping layer, where the oxygen barrier layer is configured to prevent spread of oxygen atoms in the resistive layer.

The second oxygen grasping layer is located in a central area of the bottom electrode metal layer.

The transverse width of the upper surface of the bottom electrode metal layer is greater than the transverse width of a lower surface of the bottom electrode metal layer; and
 dimensions of the bottom electrode metal layer and the second oxygen grasping layer meet the following relationship:

$$F1 = D1 - (2*D3);$$

$$H2 = H1 * F1/(D1-D2);$$

where the F1 is the maximum transverse width of the second oxygen grasping layer, the H2 is the depth of the second oxygen grasping layer, the H1 is the depth of the bottom electrode metal layer, the D1 is the transverse width of the upper surface of the bottom electrode metal layer, the D2 is the transverse width of the lower surface of the bottom electrode metal layer, and the D3 is the thickness of the bottom electrode metal layer.

The maximum transverse width of the second oxygen grasping layer is less than or equal to 6 nanometers.

The embodiments of the present disclosure further provide a manufacturing method of a semiconductor device, including:
 forming a bottom electrode metal layer in a semiconductor substrate, where the bottom electrode metal layer includes a second oxygen grasping layer, and upper surfaces of the semiconductor substrate, the bottom electrode metal layer, and the second oxygen grasping layer are flush;
 depositing a resistive layer composition material, a first oxygen grasping layer composition material, and a top electrode metal layer composition material on the upper surfaces of the semiconductor substrate, the bottom electrode metal layer, and the second oxygen grasping layer in sequence; and
 patterning the resistive layer composition material, the first oxygen grasping layer composition material, and the top electrode metal layer composition material to form a resistive layer, a first oxygen grasping layer, and a top electrode metal layer, where the resistive layer has a variable resistance.

The manufacturing method further includes:

depositing an oxygen barrier layer composition material above the resistive layer; and patterning the oxygen barrier layer composition material to form an oxygen barrier layer, where the oxygen barrier layer is located between the resistive layer and the first oxygen grasping layer, and the oxygen barrier layer is configured to prevent spread of oxygen atoms in the resistive layer.

The forming the bottom electrode metal layer on the semiconductor substrate includes:

forming a bottom electrode notch on the semiconductor substrate, where the transverse width of an upper surface of the bottom electrode notch is greater than the transverse width of a lower surface of the bottom electrode notch;

depositing a bottom electrode metal layer composition material at the bottom electrode notch, and forming a second oxygen grasping layer notch in a central area of the bottom electrode metal layer composition material;

depositing a second oxygen grasping layer material at the second oxygen grasping layer notch; and adopting an etching process or a chemical mechanical polishing CMP process to remove the protruding bottom electrode metal layer composition material and the second oxygen grasping layer material, form the bottom electrode metal layer and the second oxygen grasping layer, so that the upper surfaces of the semiconductor substrate, the bottom electrode metal layer, and the second oxygen grasping layer are flush.

Dimensions of the bottom electrode metal layer and the second oxygen grasping layer meet the following relationship:

$$F1=D1-(2*D3);$$

$$H2=H1*F1/(D1-D2);$$

where the F is the maximum transverse width of the second oxygen grasping layer, the H2 is the depth of the second oxygen grasping layer, the H1 is the depth of the bottom electrode metal layer, the D1 is the transverse width of the upper surface of the bottom electrode metal layer, the D2 is the transverse width of the lower surface of the bottom electrode metal layer, and the D3 is the thickness of the bottom electrode metal layer.

The maximum transverse width of the second oxygen grasping layer is less than or equal to 6 nanometers.

Compared with the prior art, the semiconductor device provided in the embodiments of the present disclosure uses two oxygen grasping layers, where the first oxygen grasping layer is located above the resistive layer of the semiconductor device, the second oxygen grasping layer is located in the bottom electrode metal layer, and the second oxygen grasping layer induces the formation of defects at a specific area of the resistive layer. Further, when forming voltage is applied to the semiconductor device, a conductive filament is more concentratedly formed on the defect area, thereby improving stability and reliability of the device.

Other features and advantages of the embodiments in the present disclosure will be described in detail in the following description of embodiments.

BRIEF DESCRIPTION OF THE DRAWINGS

The drawings are used to provide further understanding of the present disclosure and constitute a part of the specification, and to explain the embodiments of the present disclosure together with the following description of embodiments, but do not constitute the limitation to the embodiments of the present disclosure. In the drawings:

FIG. 3 shows a cross-sectional view of a bottom electrode metal layer of a semiconductor device according to an embodiment of the present disclosure;

FIG. 4 shows a flowchart of a manufacturing method of a semiconductor device according to an embodiment of the present disclosure;

DETAILED DESCRIPTION

Figure 1:
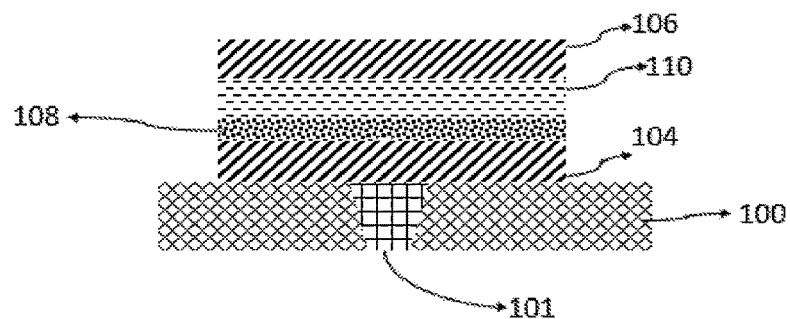
FIG. 1 shows a structural diagram of an existing RRAM.

Various exemplary embodiments of the present disclosure will now be described in detail with reference to the drawings. It should be noted that, unless otherwise specified, relative arrangements, numerical expressions and values of components and steps described in the embodiments do not limit the scope of the present disclosure.

At the same time, it should be understood that, for the convenience of description, dimensions of each part shown in the drawings are not drawn according to an actual proportional relationship.

The following description of at least one exemplary embodiment is in fact merely illustrative, and in no way serves as any limitation on the present disclosure and application or use thereof.

The technologies, methods and equipments known to those ordinary skilled in the related fields may not be discussed in detail, but if appropriate, the technologies, methods and equipments shall be considered as a part of the authorized specification.

In all the examples shown and discussed herein, any specific value should be explained as merely illustrative, but not limitations. Therefore, other examples of the exemplary embodiments may have different values.

Figure 2:
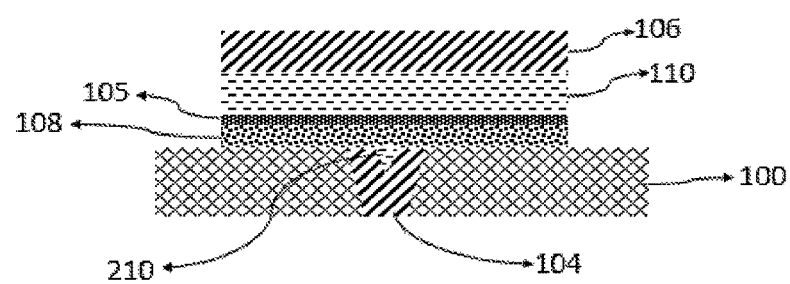
FIG. 2 shows a cross-sectional view of a semiconductor device according to an embodiment of the present disclosure.

FIG. 2 shows a cross-sectional view of a semiconductor device according to an embodiment of the present disclosure.

Referring to FIG. 2, the semiconductor device includes: a semiconductor substrate 100, where the semiconductor substrate 100 can be a wafer with a plurality of device function domains formed by a semiconductor process from undoped monocrystalline silicon, doped monocrystalline silicon, silicon on insulator (SOI) and other wafers. A bottom electrode metal layer 104 located in the semiconductor substrate 100 and a top electrode metal layer 106 located on the semiconductor substrate 100 constitute a conductive connection layer of the semiconductor device, where the bottom electrode metal layer 104 and the top electrode metal layer 106 are respectively connected to a lower metal interconnection layer and an upper metal interconnection layer (not shown in FIG. 2). A composition material of the bottom electrode metal layer 104 and the top electrode metal layer 106 can be one or more of titanium (Ti), tantalum (Ta), titanium nitride (TiN) or tantalum nitride (TaN). The resistive layer 108 is provided between the bottom electrode metal layer 104 and the top electrode metal layer 106, and covers the bottom electrode metal layer 104. A sidewall of the resistive layer 108 is vertically aligned with a sidewall of the top electrode metal layer 106. The material of the resistive layer 108 is a material with a variable resistance that undergoes a reversible phase transition between a high resistance state and a low resistance state. For example, the material of the resistive layer 108 can be a transition metal oxide, including one or more of hafnium oxide (HfOx), aluminum oxide (AlOx), tantalum oxide (TaOx) or aluminium hafnium oxide (HfAlO) and other composite combinations.

In some embodiments, a first oxygen grasping layer 110 can be provided between the bottom electrode metal layer 104 and the top electrode metal layer 106, and a sidewall of the first oxygen grasping layer 110 is vertically aligned with the side wall of the top electrode metal layer 106. The first oxygen grasping layer 110 has a lower oxygen concentration than that of the resistive layer 108, and oxygen atoms can be extracted from the resistive layer 108 to cause that a resistance changes in the resistive layer 108. In this embodiment, a material of the first oxygen grasping layer 110 can be titanium (Ti), hafnium (Hf), platinum (Pt), ruthenium (Ru) or other composite metal films.

In some embodiments, an oxygen barrier layer 105 can be provided between the bottom electrode metal layer 104 and the top electrode metal layer 106, and a sidewall of the oxygen barrier layer 105 can also be vertically aligned with the sidewall of the top electrode metal layer 106. In some examples, the oxygen barrier layer 105 can be composed of a hard mask material, which includes aluminum oxide (Al2O3), titanium oxide (TiOx), titanium oxynitride (TiON), silicon oxynitride (SiON), silicon dioxide (SiO2), silicon carbide (SiC), silicon nitride (SiNx) or other composite dielectric films. A function of the oxygen barrier layer 105 is to prevent the oxygen atoms in the resistive layer 108 from spreading to the first oxygen grasping layer 110.

Back to FIG. 2, the semiconductor device further includes a second oxygen grasping layer 210, where the second oxygen grasping layer 210 is located in the bottom electrode metal layer 104, an upper surface of the second oxygen grasping layer 210 is aligned with an upper surface of the bottom electrode metal layer 104 and an upper surface of the semiconductor substrate 100, and the resistive layer 108 covers the semiconductor substrate 100, the bottom electrode metal layer 104 and the second oxygen grasping layer 210.

In some embodiments, the bottom electrode metal layer 104 penetrates the semiconductor substrate 100, a lower surface of the bottom electrode metal layer 104 is connected with a lower metal interconnection layer, and the width of the upper surface of the bottom electrode metal layer 104 is greater than the width of the lower surface of the bottom electrode metal layer 104. Preferably, a cross-sectional view of the bottom electrode metal layer 104 can be inverted trapezoid. Of course, the embodiments of the present disclosure do not limit a cross-sectional profile of the bottom electrode metal layer 104, as long as the width of the upper surface of the bottom electrode metal layer 104 is greater than the width of the lower surface of the bottom electrode metal layer 104. FIG. 3 shows a cross-sectional view of a bottom electrode metal layer 104 of a semiconductor device according to an embodiment of the present disclosure.

Figure 11:
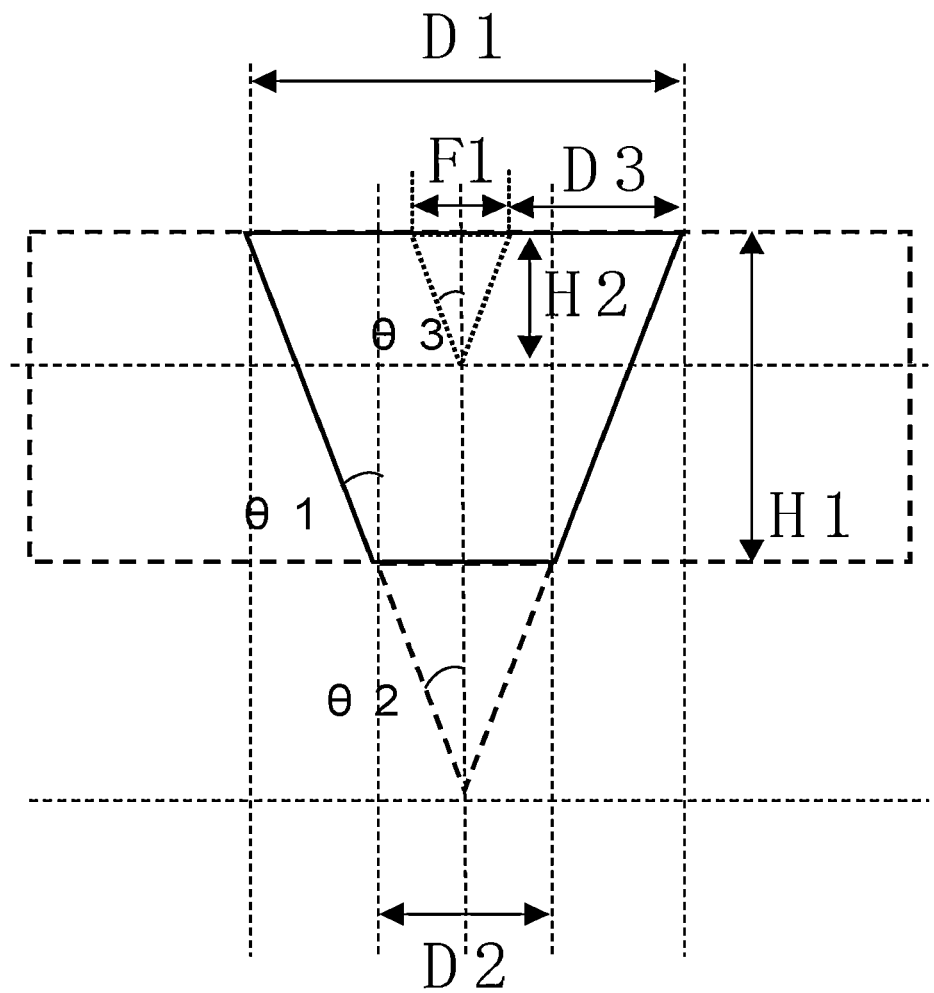
FIG. 11 shows a dimension relationship between a bottom electrode metal layer and a second oxygen grasping layer according to an embodiment of the present disclosure.

In the embodiments of the present disclosure, a size of the second oxygen grasping layer 210 can be controlled by changing the thickness of the bottom electrode metal layer 104. According to a schematic diagram of a dimension relationship between a bottom electrode metal layer and a second oxygen grasping layer shown in FIG. 11, it can be seen:

$$F1=D1-(2*D3);$$

$$H2=H1*F1/(D1-D2);$$

where the F1 is the maximum transverse width of the second oxygen grasping layer, the H2 is the depth of the second oxygen grasping layer, the H1 is the depth of the bottom electrode metal layer (that is, the thickness of a semiconductor substrate), the D1 is the transverse width of the upper surface of the bottom electrode metal layer, the D2 is the transverse width of the lower surface of the bottom electrode metal layer, and the D3 is the thickness of the bottom electrode metal layer.

When preparing the semiconductor device, a bottom electrode notch on the semiconductor substrate (for depositing a bottom electrode metal layer material) is usually fixed, that is, D1 and D2 are known. According to the above formulas, it can be seen that when depositing the bottom electrode metal layer material in the notch, the size of the second oxygen grasping layer can be controlled by controlling the thickness D3 of the bottom electrode metal layer.

In one embodiment, the maximum transverse width of the second oxygen grasping layer 210 (that is, the transverse width of the upper surface) is less than or equal to 6 nanometers.

In some embodiments, a ratio of a transverse width value of the upper surface of the bottom electrode metal layer 104 to a maximum transverse width value of the second oxygen grasping layer 210 is greater than or equal to 20:3. As shown in FIG. 3, for example, the transverse width of the upper surface of the bottom electrode metal layer 104 is 40 nanometers, the transverse width of the lower surface of the bottom electrode metal layer 104 is 30 nanometers, and the maximum transverse width of the second oxygen grasping layer 210 is 6 nanometers.

It should be pointed out that the embodiments of the present disclosure do not specifically limit the size of the second oxygen grasping layer 210, as long as the second oxygen grasping layer 210 does not penetrate the bottom electrode metal layer 104.

The second oxygen grasping layer 210 has the lower oxygen concentration than that of the resistive layer 108, and the oxygen atoms can be extracted from the resistive layer 108 to cause that the resistance changes in the resistive layer 108. In each embodiment, the second oxygen grasping layer 210 may include titanium (Ti), hafnium (Hf), platinum (Pt), ruthenium (Ru) or other composite metal films.

Figure 10:
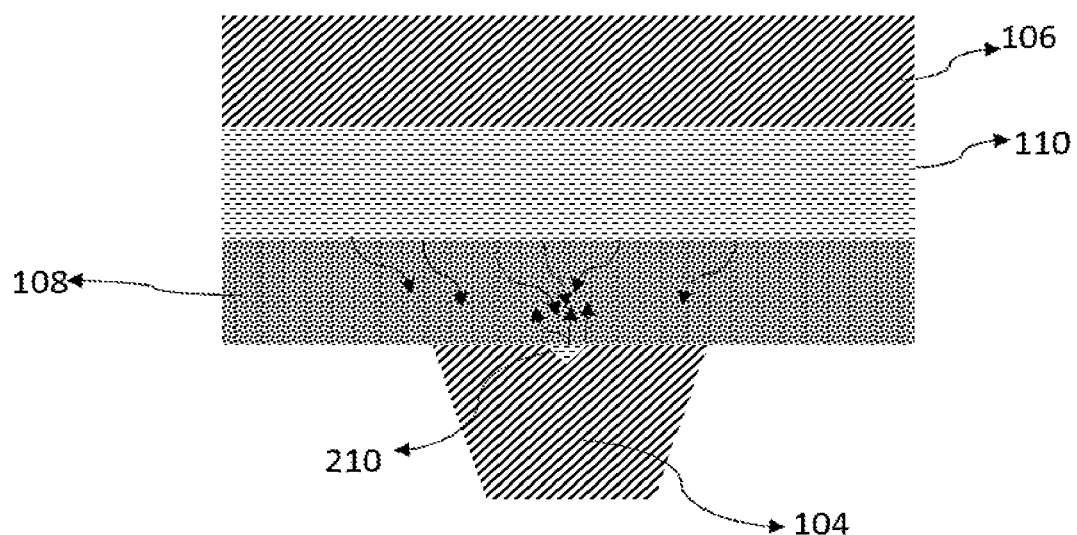
FIG. 10 shows a forming process of a conductive filament of a semiconductor device in a resistive layer according to an embodiment of the present disclosure.

Referring to FIG. 10, since a semiconductor device includes a first oxygen grasping layer 110 and a second oxygen grasping layer 210, the first oxygen grasping layer 110 first grasps oxygen atoms at an upper part of a resistive layer 108, and then defects at the upper part of the resistive layer 108 are produced accordingly. With the accumulation of the defects, a conductive filament will be formed in the resistive layer 108 from top to bottom. The second oxygen grasping layer 210 first grasps oxygen atoms at a lower part of the resistive layer 108, and then defects at the lower part of the resistive layer 108 are produced accordingly. With the accumulation of the defects, a conductive filament will be formed in the resistive layer 108 from bottom to top. That is to say, in the embodiments of the present disclosure, the conductive filaments with opposite directions will be formed in the resistive layer 108 of the semiconductor device. The second oxygen grasping layer 210 induces the formation of defects at a specific area (that is, an area where the resistive layer 108 corresponds to the second oxygen grasping layer 210 in a vertical direction) of the resistive layer 108. Further, when forming voltage is applied to the semiconductor device, the conductive filament is more concentratedly formed in the defect area, thereby improving stability and reliability of the device.

In some embodiments, the second oxygen grasping layer 210 is located in a central area of the bottom electrode metal layer 104 (the central area refers to a central area of the bottom electrode metal layer 104 in a transverse direction, as shown in FIG. 3), so that when the forming voltage is applied to the semiconductor device, the conductive filament is more concentratedly formed in the central area of the resistive layer 108.

The present disclosure further provides a manufacturing method of a semiconductor device, as shown in FIG. 4, including:

step S21: forming a bottom electrode metal layer in a semiconductor substrate, where the bottom electrode metal layer includes a second oxygen grasping layer, and upper surfaces of the semiconductor substrate, the bottom electrode metal layer, and the second oxygen grasping layer are flush;

step S22: depositing a resistive layer composition material, a first oxygen grasping layer composition material, and a top electrode metal layer composition material on the upper surfaces of the semiconductor substrate, the bottom electrode metal layer, and the second oxygen grasping layer in sequence; and step S23: patterning the resistive layer composition material, the first oxygen grasping layer composition material, and the top electrode metal layer composition material to form a resistive layer, a first oxygen grasping layer, and a top electrode metal layer, where the resistive layer has a variable resistance.

In some embodiments, the manufacturing method includes: depositing an oxygen barrier layer composition material on the resistive layer; and patterning the oxygen barrier layer composition material to form an oxygen barrier layer, where the oxygen barrier layer is located between the resistive layer and the first oxygen grasping layer, and the oxygen barrier layer is configured to prevent spread of oxygen atoms in the resistive layer.

Figure 5:
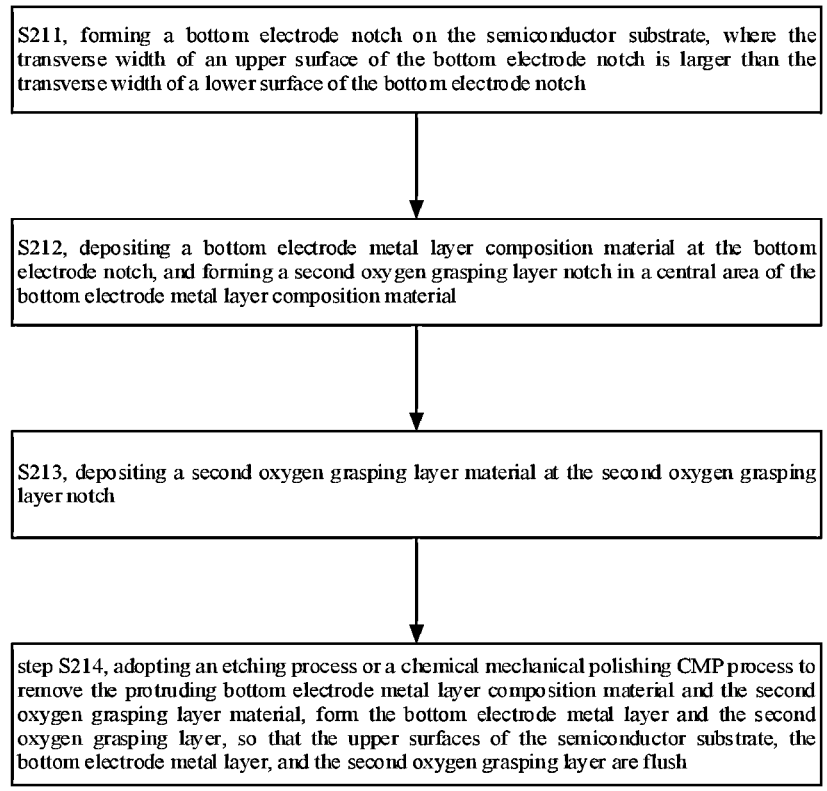
FIG. 5 shows a flowchart of one of steps of a manufacturing method of a semiconductor device according to an embodiment of the present disclosure.

In some embodiments, as shown in FIG. 5, the step S21 includes:

step S211: forming a bottom electrode notch on the semiconductor substrate, where the transverse width of an upper surface of the bottom electrode notch is greater than the transverse width of a lower surface of the bottom electrode notch;

step S212: depositing a bottom electrode metal layer composition material at the bottom electrode notch, and forming a second oxygen grasping layer notch in a central area of the bottom electrode metal layer composition material;

step S213: depositing a second oxygen grasping layer material at the second oxygen grasping layer notch; and step S214: adopting an etching process or a chemical mechanical polishing CMP process to remove the protruding bottom electrode metal layer composition material and the second oxygen grasping layer material, form the bottom electrode metal layer and the second oxygen grasping layer, so that the upper surfaces of the semiconductor substrate, the bottom electrode metal layer and the second oxygen grasping layer are flush.

The following will refer to FIG. 6 to FIG. 9, and a process of forming a bottom electrode metal layer and a second oxygen grasping layer on a semiconductor substrate shown in FIG. 5 will be described.

Figure 6:
FIG. 6 shows a cross-sectional view of a configuration of one stage in a manufacturing process of a semiconductor device according to an embodiment of the present disclosure.

As shown in FIG. 6, a semiconductor substrate 100 is provided, and a bottom electrode notch is formed in the semiconductor substrate, which penetrates the semiconductor substrate 100, and the transverse width of an upper surface of the notch is greater than the transverse width of a lower surface of the notch.

Figure 7:
FIG. 7 shows a cross-sectional view of a configuration of one stage in a manufacturing process of a semiconductor device according to an embodiment of the present disclosure.

As shown in FIG. 7, a bottom electrode metal layer composition material 14 is deposited at the bottom electrode notch. Due to characteristics of the bottom electrode metal layer composition material, a V-shaped notch will be formed in a central area when depositing the bottom electrode metal layer composition material.

Figure 8:
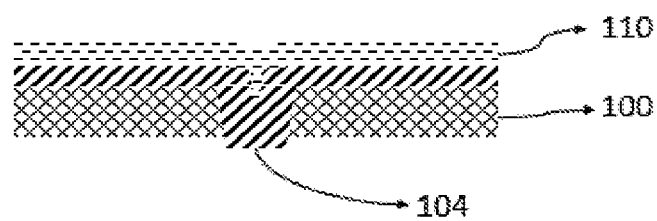
FIG. 8 shows a cross-sectional view of a configuration of one stage in a manufacturing process of a semiconductor device according to an embodiment of the present disclosure.

As shown in FIG. 8, an oxygen grasping layer composition material 10 is deposited at the V-shaped notch.

Figure 9:
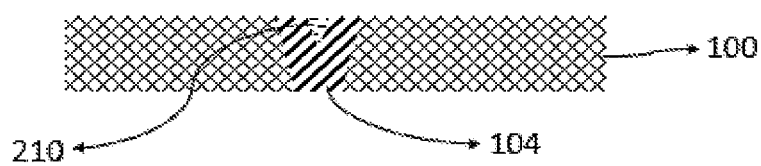
FIG. 9 shows a cross-sectional view of a configuration of one stage in a manufacturing process of a semiconductor device according to an embodiment of the present disclosure.

As shown in FIG. 9, the protruding oxygen grasping layer composition material 10 and bottom electrode metal layer composition material 14 can be removed by adopting an etching process or a chemical mechanical polishing CMP process to form a bottom electrode metal layer 104 and a second oxygen grasping layer 210, so that upper surfaces of the semiconductor substrate, the bottom electrode metal layer and the second oxygen grasping layer are flush.

In one embodiment, dimensions of the bottom electrode metal layer and the second oxygen grasping layer meet the following relationship:

$$F1=D1-(2*D3);$$

$$H2=H1*F1/(D1-D2);$$

where the F1 is the maximum transverse width of the second oxygen grasping layer, the H2 is the depth of the second oxygen grasping layer, the H1 is the depth of the bottom electrode metal layer, the D1 is the transverse width of the upper surface of the bottom electrode metal layer, the D2 is the transverse width of the lower surface of the bottom electrode metal layer, and the D3 is the thickness of the bottom electrode metal layer.

When preparing the semiconductor device, the bottom electrode notch on the semiconductor substrate is usually fixed, that is, D1 and D2 are known. According to the above formulas, when depositing the bottom electrode metal layer material in the bottom electrode notch, the size of the second oxygen grasping layer can be controlled by controlling the thickness D3 of the bottom electrode metal layer.

In one embodiment, the maximum transverse width of the second oxygen grasping layer 210 is less than or equal to 6 nanometers.

In another embodiment, a ratio of the transverse width of the upper surface of the bottom electrode metal layer 104 to the maximum transverse width of the second oxygen grasping layer 210 is greater than or equal to 20:3.

Through the semiconductor device provided by the above embodiments of the present disclosure, the second oxygen grasping layer induces the formation of defects at a specific area of the resistive layer. Further, when the forming voltage is applied to the semiconductor device, the conductive filament is more concentratedly formed in the defect area, thereby improving the stability and reliability of the device.

The foregoing description is intended to enable those skilled in the art to implement and use the content of the present disclosure, and is provided in the context of specific applications and their requirements. In addition, the foregoing description of the embodiments of the present disclosure is given merely for the purpose of illustration and description. They are not intended to be exhaustive or to limit the present disclosure to the disclosed form. Therefore, many modifications and variations will be obvious for those skilled practitioners in the art, and the general principles defined herein can be applied to other embodiments and applications without departing from the essence and scope of the present disclosure. In addition, the foregoing discussion of the embodiments is not intended to limit the present disclosure. Therefore, the present disclosure is not intended to be limited to the embodiments shown, but will be given the widest scope consistent with the principles and features disclosed herein.

The invention claimed is:

1. A semiconductor device, comprising:
a semiconductor substrate;
a bottom electrode metal layer located in the semiconductor substrate and a top electrode metal layer located on the semiconductor substrate;
a resistive layer located between the bottom electrode metal layer and the top electrode metal layer, wherein the resistive layer has a variable resistance;
a first oxygen grasping layer located between the bottom electrode metal layer and the top electrode metal layer, wherein the first oxygen grasping layer is located above the resistive layer; and
a second oxygen grasping layer located in the bottom electrode metal layer, wherein upper surfaces of the semiconductor substrate, the bottom electrode metal layer and the second oxygen grasping layer are flush, and the resistive layer covers the semiconductor substrate, the bottom electrode metal layer and the second oxygen grasping layer.

2. The semiconductor device according to claim 1, further comprising:
an oxygen barrier layer located between the resistive layer and the first oxygen grasping layer, wherein the oxygen barrier layer is configured to prevent spread of oxygen atoms in the resistive layer.

3. The semiconductor device according to claim 1, wherein the second oxygen grasping layer is located in a central area of the bottom electrode metal layer.

4. The semiconductor device according to claim 3, wherein the transverse width of the upper surface of the bottom electrode metal layer is greater than the transverse width of a lower surface of the bottom electrode metal layer; and
dimensions of the bottom electrode metal layer and the second oxygen grasping layer meet the following relationship:

$$F1=D1-(2*D3);$$

$$H2=H1*F1/(D1-D2);$$

wherein the F1 is the maximum transverse width of the second oxygen grasping layer, the H2 is the depth of the second oxygen grasping layer, the H1 is the depth of the bottom electrode metal layer, the D1 is the transverse width of the upper surface of the bottom electrode metal layer, the D2 is the transverse width of the lower surface of the bottom electrode metal layer, and the D3 is the thickness of the bottom electrode metal layer.

5. The semiconductor device according to claim 4, wherein the maximum transverse width of the second oxygen grasping layer is less than or equal to 6 nanometers.

6. A manufacturing method of a semiconductor device, comprising:
forming a bottom electrode metal layer in a semiconductor substrate, wherein the bottom electrode metal layer comprises a second oxygen grasping layer, and upper surfaces of the semiconductor substrate, the bottom electrode metal layer, and the second oxygen grasping layer are flush;
depositing a resistive layer composition material, a first oxygen grasping layer composition material, and a top electrode metal layer composition material on the upper surfaces of the semiconductor substrate, the bottom electrode metal layer, and the second oxygen grasping layer in sequence; and
patterning the resistive layer composition material, the first oxygen grasping layer composition material, and the top electrode metal layer composition material to form a resistive layer, a first oxygen grasping layer, and a top electrode metal layer, wherein the resistive layer has a variable resistance.

7. The manufacturing method according to claim 6, further comprises:
depositing an oxygen barrier layer composition material on the resistive layer; and
patterning the oxygen barrier layer composition material to form an oxygen barrier layer, wherein the oxygen barrier layer is located between the resistive layer and the first oxygen grasping layer, and the oxygen barrier layer is configured to prevent spread of oxygen atoms in the resistive layer.

8. The manufacturing method according to claim 6, wherein the forming the bottom electrode metal layer on the semiconductor substrate comprises:
forming a bottom electrode notch on the semiconductor substrate, wherein the transverse width of an upper surface of the bottom electrode notch is greater than the transverse width of a lower surface of the bottom electrode notch;
depositing a bottom electrode metal layer composition material at the bottom electrode notch, and forming a second oxygen grasping layer notch in a central area of the bottom electrode metal layer composition material;
depositing a second oxygen grasping layer material at the second oxygen grasping layer notch; and
adopting an etching process or a chemical mechanical polishing CMP process to remove the protruding bottom electrode metal layer composition material and the second oxygen grasping layer material, form the bottom electrode metal layer and the second oxygen grasping layer, so that the upper surfaces of the semiconductor substrate, the bottom electrode metal layer, and the second oxygen grasping layer are flush.

9. The manufacturing method according to claim 8, wherein dimensions of the bottom electrode metal layer and the second oxygen grasping layer meet the following relationship:

$$F1=D1-(2*D3);$$

$$H2=H1*F1/(D1-D2);$$

wherein the F1 is the maximum transverse width of the second oxygen grasping layer, the H2 is the depth of the second oxygen grasping layer, the H1 is the depth of the bottom electrode metal layer, the D1 is the transverse width of the upper surface of the bottom electrode metal layer, the D2 is the transverse width of the lower surface of the bottom electrode metal layer, and the D3 is the thickness of the bottom electrode metal layer.

10. The manufacturing method according to claim 9, wherein the maximum transverse width of the second oxygen grasping layer is less than or equal to 6 nanometers.

11. The semiconductor device according to claim 2, wherein the second oxygen grasping layer is located in a central area of the bottom electrode metal layer.

12. The manufacturing method according to claim 7, wherein the forming the bottom electrode metal layer on the semiconductor substrate comprises:

forming a bottom electrode notch on the semiconductor substrate, wherein the transverse width of an upper surface of the bottom electrode notch is greater than the transverse width of a lower surface of the bottom electrode notch;

depositing a bottom electrode metal layer composition material at the bottom electrode notch, and forming a second oxygen grasping layer notch in a central area of the bottom electrode metal layer composition material;

depositing a second oxygen grasping layer material at the second oxygen grasping layer notch; and adopting an etching process or a chemical mechanical polishing CMP process to remove the protruding bottom electrode metal layer composition material and the second oxygen grasping layer material, form the bottom electrode metal layer and the second oxygen grasping layer, so that the upper surfaces of the semiconductor substrate, the bottom electrode metal layer, and the second oxygen grasping layer are flush.

* * * * *